United States Patent
Joshi (10) Patent No.: US 7,122,487 B2
(45) Date of Patent: Oct. 17, 2006

(54) METHOD FOR FORMING AN OXIDE WITH IMPROVED OXYGEN BONDING

(75) Inventor: Pooran Chandra Joshi, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 228 days.

(21) Appl. No.: 10/801,377

(22) Filed: Mar. 15, 2004

(65) Prior Publication Data
US 2004/0214365 A1    Oct. 28, 2004

Related U.S. Application Data

(63) Continuation-in-part of application No. 10/295,400, filed on Nov. 14, 2002, now Pat. No. 6,902,960.

(51) Int. Cl.
*H01L 21/31* (2006.01)

(52) U.S. Cl. ............... 438/788; 438/787; 438/771

(58) Field of Classification Search ............ None
See application file for complete search history.

(56) References Cited

U.S. PATENT DOCUMENTS

| | | | |
|---|---|---|---|
| 5,796,121 A | 8/1998 | Gates | 257/59 |
| 5,817,550 A | 10/1998 | Carey et al. | 438/166 |
| 6,057,210 A * | 5/2000 | Yang et al. | 438/427 |
| 6,187,662 B1 * | 2/2001 | Usami et al. | 438/624 |
| 6,207,472 B1 | 3/2001 | Callegari et al. | 438/99 |
| 6,387,749 B1 * | 5/2002 | Lim | 438/240 |
| 6,646,287 B1 * | 11/2003 | Ono et al. | 257/66 |
| 6,689,646 B1 * | 2/2004 | Joshi et al. | 438/149 |
| 6,902,960 B1 * | 6/2005 | Joshi et al. | 438/149 |

* cited by examiner

Primary Examiner—Zandra V. Smith
Assistant Examiner—Khanh Duong
(74) Attorney, Agent, or Firm—Law Office of Gerald Maliszewski; Gerald Maliszewski (57) ABSTRACT

A deposition oxide interface with improved oxygen bonding and a method for bonding oxygen in an oxide layer are provided. The method includes depositing an M oxide layer where M is a first element selected from a group including elements chemically defined as a solid and having an oxidation state in a range of +2 to +5, plasma oxidizing the M oxide layer at a temperature of less than 400° C. using a high density plasma source, and in response to plasma oxidizing the M oxide layer, improving M-oxygen bonding in the M oxide layer. The plasma oxidation process diffuses excited oxygen radicals into the oxide layer. The plasma oxidation is performed at specified parameters including temperature, power density, pressure, process gas composition, and process gas flow. In some aspects of the method, M is silicon, and the oxide interface is incorporated into a thin film transistor.

24 Claims, 5 Drawing Sheets

| Tdep (°C) | d (Å) | PLASMA OXIDATION | $V_{FB}$ (V) | $N_f$ (cm$^{-2}$) (×10$^{11}$ cm$^{-2}$) | Dit (cm-2 eV-1) (×10$^{10}$ cm-2 eV-1) | J (A/cm2) (At 2 MV/cm) | E (MV/cm) (AT J=10$^{-8}$ A/cm$^2$) | EBD (MV/cm) (PHYSICAL) |
|---|---|---|---|---|---|---|---|---|
| 150 | 500 | As-Dep | -7.5 | 26.0 | 3.5 | 1.80E-07 | 4.3 | 6.8 |
| 150 | 500 | He/O$_2$ | -0.8 | 1.8 | 1.2 | 2.60E-08 | 8.4 | 7.2 |

TABLE 1

TABLE 2

METHOD FOR FORMING AN OXIDE WITH IMPROVED OXYGEN BONDING

RELATED APPLICATIONS

This application is a continuation-in-part of a application entitled, OXIDE INTERFACE AND A METHOD FOR FABRICATING OXIDE THIN FILMS, invented by Pooran Chandra. Joshi, Ser. No. 10/295,400, filed Nov. 14, 2002 now U.S. Pat. No. 6,902,960.

BACKGROUND OF THE INVENTION

1. Field of the Invention

This invention generally relates to the fabrication of integrated circuit (IC) devices, and more particularly, to a deposition oxide interface with improved oxygen bonding and a method for forming the same oxide interface using high-density plasma.

2. Description of the Related Art

Figure 1:
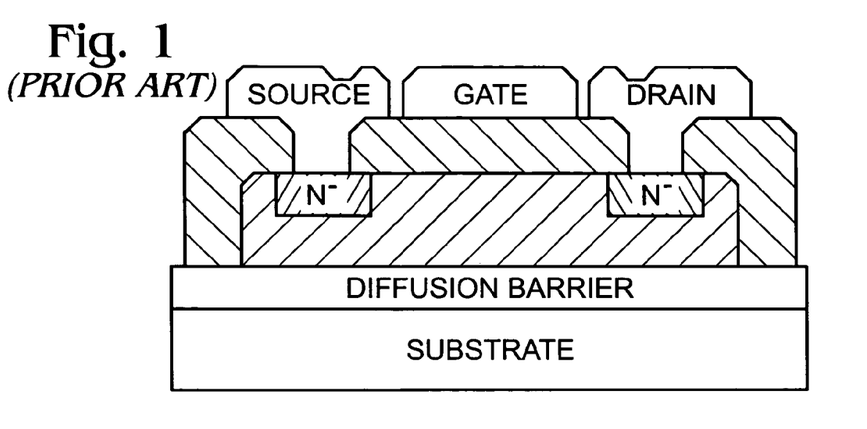
FIG. 1 is a schematic of a stacked gate structure for a thin film transistor (TFT) (prior art).

FIG. 1 is a schematic of a stacked gate structure for a thin film transistor (TFT) (prior art). The proper performance of devices employing an oxide interface depends, in part, on the characteristics of the oxide interface within the device structure. A TFT using silicon oxide is presented as an illustration, however, it is understood that the discussion applies to other IC devices and to other types of oxides as well. In FIG. 1, oxide layers form the gate insulator. The bulk, or physical, characteristics and the interface, or electrical, characteristics of the gate insulator are very important for the operation of a TFT. Silicon dioxide ($SiO_2$) is a suitable dielectric for the fabrication of TFTs because of its excellent micro structural and electrical characteristics.

Typically, conventional fabrication and post-depositional processing of $SiO_2$ thin films are performed at temperatures greater than 400° C. hereafter referred to as high temperatures. High temperatures are used to enhance bulk and interface characteristics for device applications and to attain economically feasible rates of production. However, even at high temperatures, the quality of silicon oxide generated by a conventional deposition process, such as plasma enhanced chemical vapor deposition (PECVD), is degraded by incomplete oxidation, impurity bonding, non-stoichiometric oxide bonding, and low density. Incomplete oxidation causes a percentage of silicon oxides in the oxide layer to take the form $SiO_x$, where x is less than 2. Impurity bonding results in the formation of undesirable compounds such as SiOH or SiH in the oxide. The impurities in these compounds, for example hydrogen, are typically derived from a precursor used as part of the deposition process. Non-stoichiometric $SiO_2$ is formed when the deposition process does not supply sufficient energy for $SiO_2$ produced by the process to reach equilibrium. $SiO_x$, non-stoichiometric $SiO_2$, and impurity compounds produce an undesired reduction in oxide layer density and adversely affect oxide layer bulk and interface characteristics.

The next generation of higher density display devices, such as liquid crystal displays (LCDs), requires high performance TFT driver components processed at temperatures less than 400° C., hereafter referred to as low temperatures. Processing TFT components at low temperatures enables the integration of oxide films on glass, plastic, and other low temperature substrates. These low temperature substrates can be used to fabricate high performance, high resolution, thin, lightweight, low-power displays. Further, a process temperature in the range of 100-300° C. does not damage transparent and flexible plastic substrates. A conventional deposition process, such as PECVD, can be performed at low temperatures. Unfortunately, performing conventional deposition processes at low temperatures exacerbates the oxide quality problems noted above and results in lower oxide deposition rates. In addition, increasing power or other processing variables at low temperatures to enhance deposition rates leads to interface damage and other problems resulting in lower interface quality.

It would be advantageous if a low temperature process could improve the bulk and interfacial properties of a deposition oxide.

It would be advantageous if a process could effectively oxidize a deposition oxide film regardless of a substrate temperature.

SUMMARY OF THE INVENTION

The present invention describes plasma oxidation of a deposition M oxide interface at temperatures below 400° C. M is a first element selected from a group including elements chemically defined as a solid and having an oxidation state in a range of +2 to +5. Depending on factors such as the oxide thickness, the resulting oxide interface bulk and interface characteristics approach those for bulk oxide. The present invention also describes a process that yields the above-mentioned oxide interface. The present invention is accomplished by performing a high-density (HD) plasma oxidation process on a deposition M oxide layer. The present invention facilitates the formation of integrated circuit (IC) devices, such as thin film transistors (TFTs), on transparent substrates, such as glass or polymer or flexible substrates, such as plastic.

Accordingly, a method is provided for bonding oxygen in an oxide layer. The method includes: depositing an M oxide layer where M is a first element selected from a group including elements chemically defined as a solid and having an oxidation state in a range of +2 to +5; plasma oxidizing the M oxide layer at a temperature of less than 400° C. using an HD plasma source; and in response to plasma oxidizing the M oxide layer, improving M-oxygen (M—O) bonding in the M oxide layer. The plasma oxidation process diffuses excited oxygen radicals into the oxide layer. In some aspects, the method bonds oxygen radicals to element M in the M oxide layer. In some aspects, the method converts M—O bonds in a non-stoichiometric state to stoichiometric M—O bonds. The plasma oxidation is performed at specified parameters including temperature, power density, pressure, process gas composition, and process gas flow. In some aspects of the method, M is silicon and the post-depositional oxidation is performed at 150° C., resulting in a silicon-containing oxide layer with a refractive index of 1.46. In some aspects of the method, the silicon and oxide layers are incorporated into a TFT. In some aspects the HD plasma source is an HD inductively coupled plasma source. In some aspects, the HD plasma source is an electron cyclotron resonance plasma source or a cathode-coupled plasma source.

Additional details of the above-described method and an oxide interface are presented in detail below.

DETAILED DESCRIPTION OF THE PREFERRED EMBODIMENTS

Figure 2:
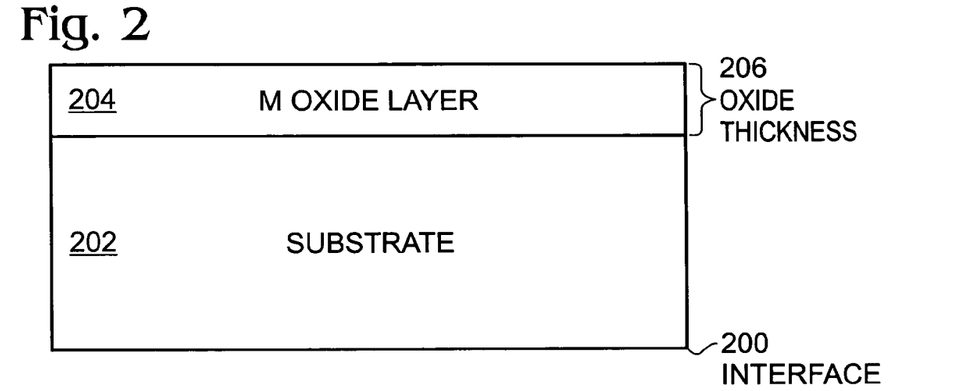
FIG. 2 is a partial cross-sectional view of a general thin film M oxide interface produced by a present invention method.

FIG. 2 is a partial cross-sectional view of a general thin film M oxide interface produced by a present invention method.

Figure 3:
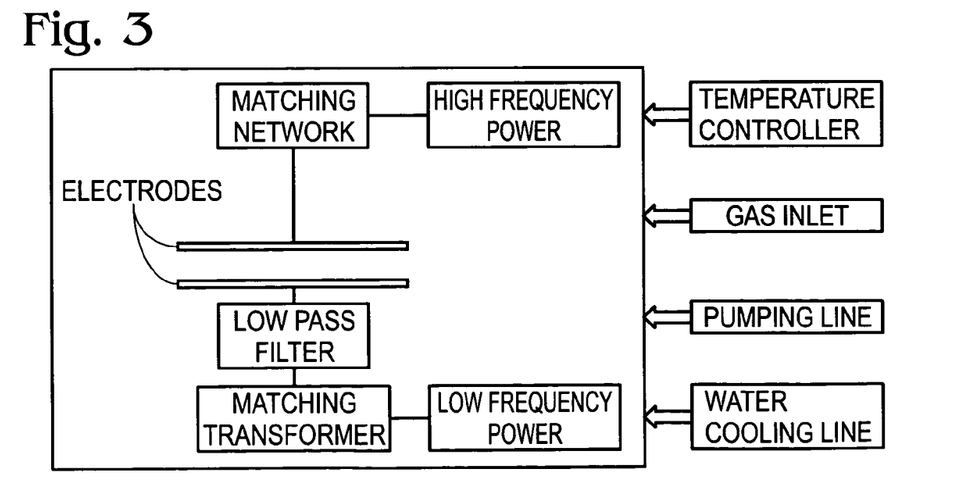
FIG. 3 is a schematic drawing of a high-density plasma enhanced chemical vapor deposition (HD-PECVD) system.

FIG. 3 is a schematic drawing of a high-density plasma enhanced chemical vapor deposition (HD-PECVD) system. The following should be considered in light of both FIGS. 2 and 3. In FIG. 2, an M oxide interface 200 consists of a transparent or flexible substrate 202 and a deposition M oxide layer 204 with a thickness 206. There are two criteria for an element M: the element is chemically defined as a solid at room temperature (approximately 20° C.) and at a pressure of one-atmosphere; and the element has an oxidation state in a range of +2 to +5. To form the M oxide layer 204, a conventional deposition process, as described below, is used to deposit an M oxide layer. Then, the as-deposited M oxide layer is oxidized using an HD plasma system at a temperature less than 400° C. In some aspects, the HD plasma system is an HD inductively coupled plasma (HD-ICP) system, for example, the system shown in FIG. 3. In some aspects the HD plasma system is an electron cyclotron resonance (ECR) plasma source or a cathode-coupled plasma source (not shown). It is understood that 400° C. is chosen as a general or average case. Depending on process parameters, some portions of the substrate 202 or M oxide layer 204 could be at temperatures greater than 400° C.

A transparent substrate 202 can be glass or polymer, but is not limited to these materials. A flexible substrate 202 can be plastic, but is not limited to plastic. Post-depositional oxidation of the oxide layer 204 at a temperature less than 400° C. enables the use of the transparent or flexible substrate 202, which can be damaged at relatively high temperatures, for example, the 400 to 1200° C. temperatures associated with conventional deposition and oxidation processes. In some aspects, the substrate 202 is composed of a rigid material, for example, silicon, and may overlie a transparent or flexible layer.

The aforementioned criteria for M are chosen to produce an M oxide layer 204 with desired characteristics. For example, zinc, a solid element with an oxidation state of +2, produces zinc oxide (ZnO) when properly oxidized. ZnO is useful for fabricating surface acoustic wave (SAW) devices. Silicon is a solid element with an oxidation state of +4. When properly oxidized, silicon produces silicon dioxide ($SiO_2$), which has numerous uses in electrical applications, for example, as a dielectric layer in integrated circuit (IC) devices. Typical forms of silicon include, but are not limited to, amorphous silicon, microcrystalline silicon, and polycrystalline silicon. Other examples of M from the Periodic Table of the Elements include the elements in column 4a and the elements in the first three rows of transition elements. M oxide layer 204 can be a binary oxide or a multi-component oxide.

The M oxide layer 204 can be deposited by a variety of techniques, including, but not limited to chemical vapor deposition (CVD), PECVD, HD-PECVD, ECR-PECVD, ICP-PECVD, photo PECVD, sputtering (examples include, but are not limited to radio frequency (RF), direct current, ion-assisted, or cathode-coupled), electron beam deposition, atomic layer deposition (ALD), and radical oxidation.

For a deposition process, the type of M oxide produced is a function of the precursor gases used. In general, the precursor gases are a mixture of reactive gases and precursor compounds having M in a decomposable form. The gases and precursor compounds are combined in a ratio selected in accordance with the valence state of M. For example, to deposit $SiO_2$, silane, tertraethoxy silane, and other silicon-containing compounds are suitable precursors. Elemental oxygen ($O_2$), ozone ($O_3$), and nitrogen oxide ($N_2O$) can be used for the oxidizing gas. Other gases can be added to a precursor gas to impart desired characteristics to the resulting oxide. For example, to incorporate nitrogen and fluorine into the M oxide layer 204, suitable precursors containing these elements can be used, such as, elemental nitrogen, fluorocarbons, or ammonia.

Bulk characteristics quantify the physical composition of M oxide layer 204, while interface characteristics measure the electrical performance of M oxide layer 204, for example, in an IC device. Depending on the thickness 206, M oxide layer 204 generally has bulk and electrical characteristics approaching those for bulk M oxide.

In some aspects, thickness 206 is more than 20 nm. In some aspects, thickness 206 is less than 20 nm. In the latter aspects, the M oxide layer 204 is particularly well suited for use in applications requiring thin layers, for example IC applications.

In some aspects, a layer (not shown) of a material containing M overlies the substrate 202 and underlies the M oxide layer 204.

Figure 4:
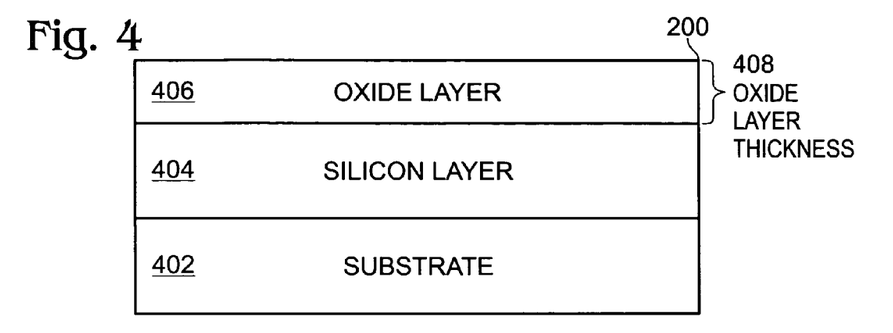
FIG. 4 is a partial cross-sectional view of a present invention M oxide interface where M is silicon.

FIG. 4 is a partial cross-sectional view of a present invention M oxide interface where M is silicon. In FIG. 4, transparent or flexible substrate 402 is overlain with a silicon layer 404. A deposition oxide layer 406, with a thickness 408 and a refractive index of 1.46, overlies the silicon layer 404. A transparent or flexible substrate 402 facilitates the use of the oxide interface 200 in display devices, such as devices with liquid crystal displays (LCDs). The silicon layer 404 can be selected from the group including amorphous silicon, microcrystalline silicon, and polycrystalline silicon. For those aspects in which M is silicon, oxide layer 406 has bulk and electrical characteristics approaching those for thermal silicon oxide. At thicknesses 408 greater than approximately 10 nanometers (nm), layer 406 has a refractive index value (a bulk characteristic) between approximately 1.45 and 1.47. As a comparison, thermal silicon oxide typically has a refractive index value of 1.46. Interface characteristics for oxide layer 406, for example, the flat-band voltage shift, leakage current density, and breakdown field strength are approximately of the same order as those for thermal oxide, as is further described below.

Figure 5:
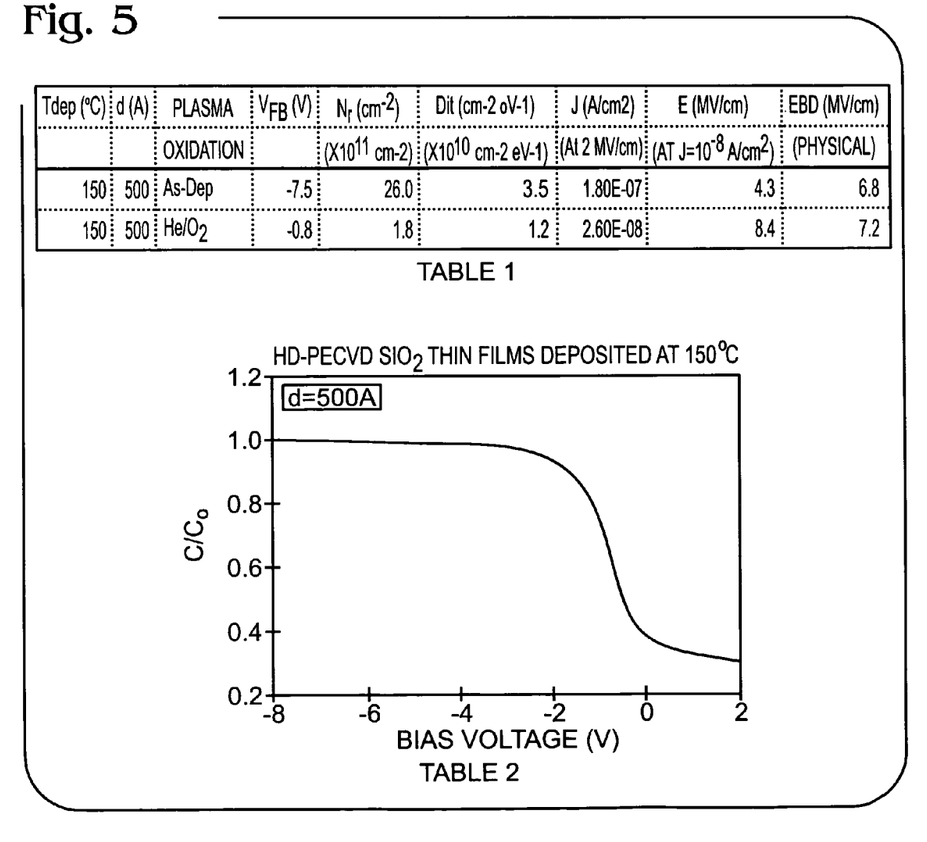
FIG. 5 shows effects of post-depositional high-density plasma oxidation on a silicon oxide thin film deposited at a temperature of 150° C.

FIG. 5 shows effects of post-depositional high-density plasma oxidation on a silicon oxide thin film deposited at a temperature of 150° C. Table 1 of FIG. 5 lists the effects on the interface characteristics of the silicon oxide thin film. The following should be considered in light of both FIGS. 4 and 5. For Table 1, an oxide layer 406, with a thickness 408 of 500 angstroms (Å), was deposited at 150° C. using an HD-PECVD process. Following deposition, the layer 406 was oxidized at 150° C. using an HD-ICP system. The first row of Table 1 shows the interface characteristics of oxide layer 406 as deposited by the HD-PECVD process. Interface characteristics measure the electrical performance of an oxide layer, for example, in an IC device. The second row of Table 1 shows the interface characteristics of oxide layer 406 following the oxidation by the HD-ICP system. Post-depositional oxidation of the layer 406 improves both the bulk and interface characteristics of the oxide layer 406. The second row of Table 1 illustrates the improvement in interface characteristics. For example, in Table 1, the fixed oxide charge density (Nf) for oxide layer 406 decreases from $26.0 \times 10^{11}$ to $1.8 \times 10^{11}$ per square centimeter ($/cm^2$) following oxidation by the HD-ICP system. Bulk, or physical, characteristics of an oxide layer, for example, layer 406, are responsive to the physical composition of the oxide layer. The refractive index, a bulk characteristic, for the oxide layer 406 of Table 1 improves from 1.44 to 1.46 (not shown). In general, the bulk and interface characteristics for the oxide layer 406 of Table 1 are suitable for IC applications. For post-deposition oxidation temperatures greater than 150° C., for example, 360° C., and for thickness 408 less than 500Å, for example, 350Å, the interface characteristics of oxide layer 406 approach or match those of thermal oxide.

Returning to FIG. 2, in some aspects, post-depositional oxidation is performed using a transmission/transformer coupled plasma (TCP) source (not shown). The use of a TCP source results in the same oxide layer 204 bulk and interface characteristics as those associated with the use of an ICP or ECR source. However, the TCP source allows the process to be scaled up for larger applications, such as LCDs.

Figure 6:
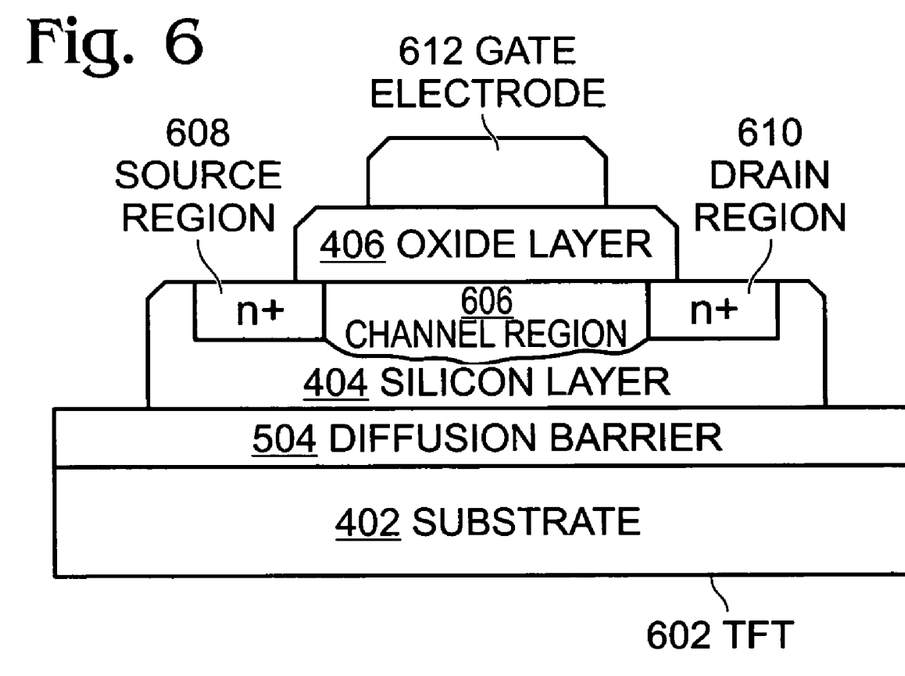
FIG. 6 is a partial cross-sectional view of a present invention thin film transistor (TFT).

FIG. 6 is a partial cross-sectional view of a present invention thin film transistor (TFT). In some aspects, the oxide interface 200 of FIG. 4 is used in a TFT. Then, in some aspects, oxide layer 406 has a thickness 408 of up to 100 nm. However, the thickness 408 is not necessarily limited to 100 nm. 100 nm is chosen to illustrate a typical thickness 408 for IC devices, for example, the TFT shown in FIG. 6, incorporating the oxide interface 200.

It should be understood that the TFT of FIG. 6 is offered only as one illustration of the invention. In the TFT 602, a diffusion barrier 604 overlies the substrate 402 and underlies the silicon layer 404. The silicon layer 404 includes a channel region 606, a source region 608, and a drain region 610. A gate electrode 612 overlies the oxide layer 406. The oxide layer 406 acts as a gate insulator.

The interface characteristics of the oxide layer 406 can be measured within the structure of the TFT 602. For example, in one aspect, the TFT 602 is fabricated with an oxide layer 406 deposited at 150° C. using an HD-PECVD process and then oxidized at 150° C. using an HD-ICP process. Then, returning to FIG. 5, the values for interface characteristics shown in the second row of Table 1 ($He/O_2$) apply to the oxide layer 406 in TFT 602.

Functional Description

The present invention M oxide interface and M oxide method combine the use of an oxide deposition process followed by post-depositional oxidation using a high-density (HD) plasma source. As described in the Background Section above, conventional deposition processes, particularly those performed at low temperatures (less than 400° C.), result in incomplete oxidation, non-stoichiometric bonding of M oxide, increased levels of impurity compounds, and reduced density for the resulting M oxide layer. The present invention addresses these problems by using an HD plasma process to diffuse, at low temperatures, excited oxygen radicals into the M oxide layer, causing the oxygen radicals to bond to element M in the M oxide layer. In this manner, the present invention addresses the problems of incomplete oxidation, non-stoichiometric bonding of M oxide, increased levels of impurity compounds, reduced density for the resulting M oxide layer, and dangling M bonds. As a result, the electrical and reliability properties of the subject M oxide layer are improved.

The present invention is effective at low temperatures because the energy for the oxygen species is derived from the HD plasma and is independent of substrate temperature. The increased energy of the oxygen species enables the species to diffuse through an oxide layer and initiate the bonding to element M noted above. In contrast, when a process such as plasma enhanced chemical vapor deposition (PECVD) is used to diffuse oxygen species into an oxide layer, damage occurs to the interface of the oxide layer, since the PECVD process requires high bias voltage to energize the oxygen species.

It is understood that the present invention is applicable to oxides deposited at low temperatures as well as oxides deposited at temperatures above 400° C. In general, as the deposition temperature decreases, the bulk and interface quality of a deposited oxide layer likewise decreases. Thus, the degree of improvement brought about by the HD plasma oxidation of the oxide layer increases as deposition temperature for the subject oxidation layer decreases.

Returning to FIG. 5, Table 2 in FIG. 5 shows typical C-V characteristics resulting from post-depositional high-density plasma oxidation of a silicon oxide layer deposited at 150° C. By producing improved silicon oxide in an oxide layer, the present invention significantly improves the bulk and interface properties for the oxide layer. For example, Table 1 in FIG. 5 shows the improvement in interface characteristics for an oxide layer deposited at 150° C. using an HD plasma enhanced chemical vapor deposition (HD-PECVD) process and then oxidized using an HD inductively coupled plasma (HD-ICP) process. Table 2 is a graphical representation of the improvement in flat band voltage resulting from post-depositional high-density plasma oxidation of a silicon oxide layer deposited at 150° C.

The present invention method is an in-situ, post-depositional process for oxidizing gate deposition oxide layers for thin film transistors (TFTs) and other integrated circuit (IC) applications. Returning to FIG. 3, the present invention can use an HD-PECVD system configuration, such as the system shown in FIG. 3. For example, the use of the system in FIG. 3 enables the electrodes in FIG. 3 to be decoupled, resulting in low self-bias at the substrate. Thus, the HD-PECVD system configuration permits independent control of plasma ion/electron density and energy to enhance bulk and interface properties.

Figure 7:
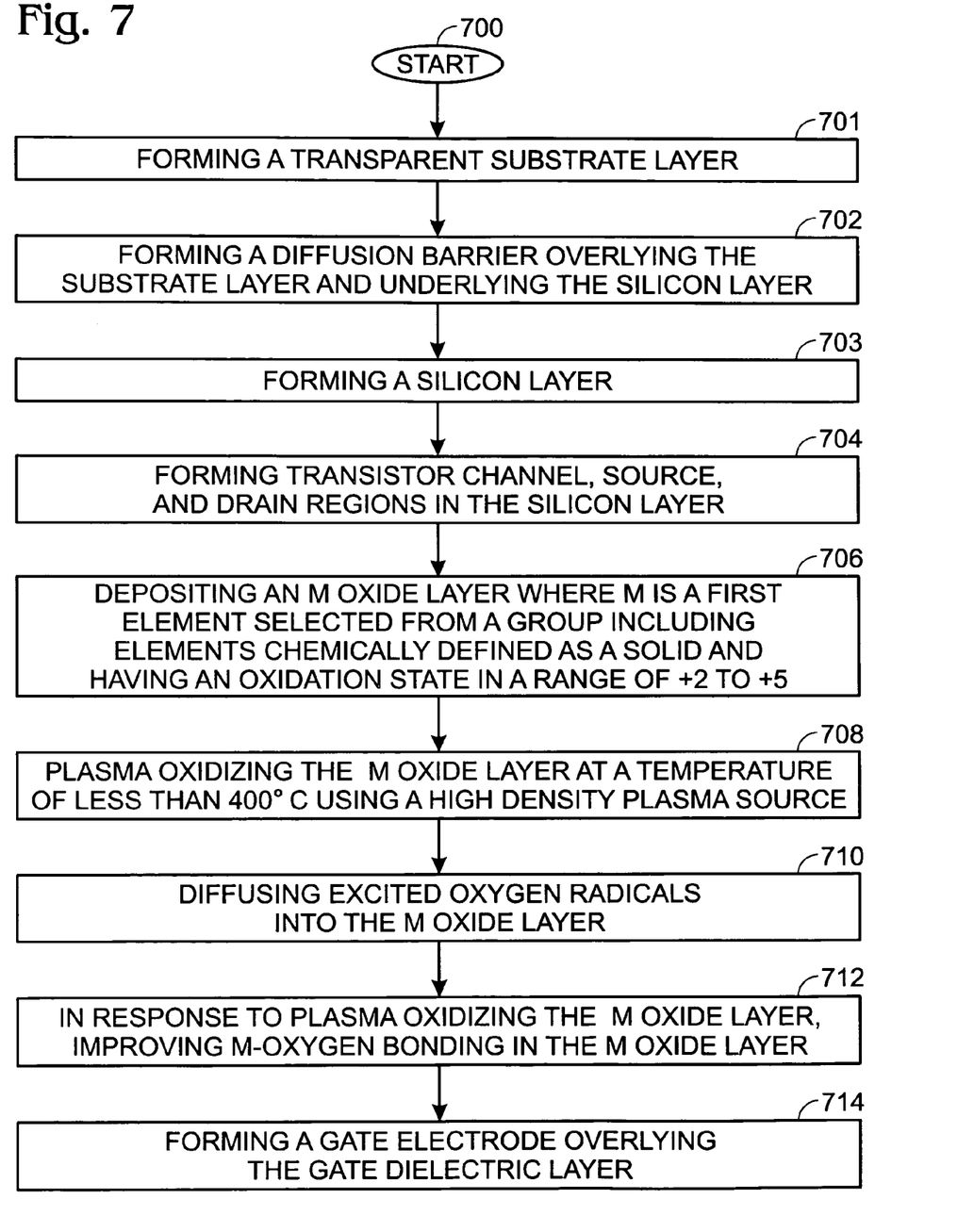
FIG. 7 is a flowchart illustrating a present invention method for bonding oxygen in an oxide layer.

FIG. 7 is a flowchart illustrating a present invention method for bonding oxygen in an oxide layer. Although the method in FIG. 7 (and FIGS. 8 and 9 below) is depicted as a sequence of numbered steps for clarity, no order should be inferred from the numbering unless explicitly stated. It should be understood that some of these steps may be skipped, performed in parallel, or performed without the requirement of maintaining a strict order of sequence. The method starts at Step 700. Step 706 deposits an M oxide layer where M is a first element selected from a group including elements chemically defined as a solid and having an oxidation state in a range of +2 to +5. Step 708 plasma oxidizes the M oxide layer at a temperature of less than 400° C. using an HD plasma source. Step 710 diffuses excited oxygen radicals into the M oxide layer. Step 712, in response to plasma oxidizing the M oxide layer, improves M-oxygen (M—O) bonding in the M oxide layer.

In some aspects, improving M—O bonding in the M oxide layer in Step 712 includes bonding oxygen radicals to element M in the M oxide layer.

In some aspects, depositing an M oxide layer in Step 706 includes depositing a first M oxide molecule with a first number of oxygen atoms. Then, bonding oxygen radicals to M atoms in the M oxide layer includes bonding oxygen radicals to the first M oxide molecule and improving M—O bonding in the M oxide layer in Step 712 includes increasing the number of oxygen atoms in the first M oxide molecule to a second number greater than the first number.

In some aspects, bonding oxygen radicals to M atoms in the M oxide layer includes bonding oxygen radicals to dangling M bonds.

In some aspects, diffusing excited oxygen radicals into the M oxide layer in Step 710 includes breaking bonds between process-induced impurity bonds attached to a first M atom. The impurity bonds can include, but are not limited to, —H, —OH, —NH, and —C. Then, bonding oxygen radicals to M atoms in the M oxide layer includes bonding oxygen radicals to the first M atom. That is, replacing the impurity bonds with bonds to oxygen radicals.

In some aspects, depositing an M oxide layer in Step 706 includes depositing an M oxide molecule with M—O bonds in a non-stoichiometric energy state. Then, improving M—O bonding in the M oxide layer in Step 712 includes converting non-stoichiometric M—O bonds to stoichiometric M—O bonds.

In some aspects, plasma oxidizing the M oxide layer at a temperature of less than 400° C. using an HD plasma source in Step 708 includes using an ICP source. In some aspects, plasma oxidizing the M oxide layer at a temperature of less than 400° C. using an HD plasma source in Step 708 includes using an electron cyclotron resonance (ECR) plasma source.

In some aspects, using an ICP source includes inductively coupling plasma in a range of 13.56 to 300 megahertz (MHz) with a power density up to 10 watts per square centimeter ($W/cm^2$); at a pressure of up to 500 milliTorr (mTorr); with a mixture of inert gas and oxygen in a ratio of approximately 10:1 to 200:1; and with a total gas flow of approximately 50 to 200 standard cubic centimeters per minute (sccm).

In some aspects, inductively coupling plasma includes using a low frequency power source at 50–460 kilohertz (KHz) 13.56 with a power density of 0.1 to 1.6 $W/cm^2$. In some aspects, inductively coupling plasma with a mixture of inert gas and oxygen includes mixing oxygen with inert gas selected from the group including helium, argon, and krypton.

In some aspects, depositing an M oxide layer in Step 706 includes using a deposition process selected from the group including chemical vapor deposition (CVD), PECVD, HD-PECVD, ECR-PECVD, ICP-PECVD, photo PECVD, ion-assisted sputtering, high density cathode coupled plasma (HD-CCP) sputtering, a combination of ICP and CCP sputtering, electron beam deposition, atomic layer deposition (ALD), and radical oxidation. In some aspects, using an HD-PECVD process to deposit the oxide layer includes depositing an oxide layer between approximately 10 and 100 nm thick.

The following describes one possible sequence for forming a TFT using the present invention method. It is understood that other sequences also are possible for FIG. 7. In some aspects, a Step 703 forms a silicon layer. Then, depositing an M oxide layer in Step 706 includes depositing an M oxide layer where M is silicon. In some aspects, Step 701 forms a transparent substrate layer and Step 702 forms a diffusion barrier overlying the substrate layer and underlying the silicon layer. Then, depositing an M oxide layer where M is silicon includes using an HD-PECVD process to deposit, overlying the silicon layer, the M oxide layer at a temperature of 150° C.; using a radio frequency (RF) power source at 13.56 MHz with a power density of 0.1 to 1.6 $W/cm^2$; at a pressure of 10 to 250 mTorr; with a mixture of $SiH_4$, $N_2O$, and $N_2$ gases in a ratio of 5–25:50–200:10–100; and with a refractive index of 1.44. Then, using an ICP source includes inductively coupling plasma at a temperature of 150° C.; using an RF power source at 13.56 MHz with a power density of 0.1 to 1.6 $W/cm^2$; at a pressure of 10 to 250 mTorr; and with a mixture of $SiH_4$, $N_2O$, and $N_2$ gases in a ratio of 5–25:50–200:10–100. Then, improving M—O bonding in the M oxide layer in Step 712 includes increasing the refractive index value from 1.44 to 1.46.

In some aspects of the method, Step 704, following the forming of a silicon layer in Step 703, forms transistor channel, source, and drain regions in the silicon layer. In some aspects of the method, depositing an M oxide layer in Step 706 includes depositing a gate dielectric layer overlying the silicon layer. Then, plasma oxidizing the M oxide layer in Step 708 includes plasma oxidizing the gate dielectric layer. In some aspects, Step 714 forms a gate electrode overlying the gate dielectric layer.

In some aspects, forming a gate dielectric layer includes forming a gate dielectric layer with a thickness of 500 angstroms (Å). Then, improving M—O bonding in the M oxide layer in Step 712 includes: decreasing a fixed oxide charge density ($N_f$) from $26.0 \times 10^{11}$ to $1.8 \times 10^{11}$ per square centimeter ($/cm^2$); decreasing an interface trap concentration from $3.5 \times 10^{10}$ to $1.2 \times 10^{10}$ per square centimeter—electron volt ($/cm^2$ eV); decreasing a flat band voltage shift ($V_{FB}$) from −7.5 to −0.8 volts (V); decreasing a leakage current density (J) from $1.8 \times 10^{-7}$ to $2.6 \times 10^{-8}$ amperes per square centimeter ($A/cm^2$) at an applied electric field of 2 megavolts per centimeter (MV/cm); increasing a breakdown field strength (EBD) from 6.8 to 7.2 MV/cm; increasing an electric field strength (E) associated with a J of $1 \times 10^{-8}$ $A/cm^2$ from 4.3 to 6.4 MV/cm; and maintaining a bias temperature shift (BTS) of less than 1 V under dual bias (±2 MV/cm) temperature stress at 150° C.

In some aspects, forming a silicon layer in Step 703 includes forming a layer selected from the group including amorphous silicon, microcrystalline silicon, and polycrystalline silicon.

In some aspects, plasma oxidizing the M oxide layer at a temperature of less than 400° C. in Step 708 includes plasma oxidizing the M oxide layer at a temperature of less than 200° C. In some aspects, plasma oxidizing the M oxide layer at a temperature of less than 200° C. includes plasma oxidizing the M oxide layer at a temperature of less than 50° C.

In some aspects, depositing an M oxide layer in Step 706 includes depositing an M oxide selected from the group including M binary oxides and M multi-component oxides. In some aspects, depositing an M oxide selected from the group including M binary oxides and M multi-component oxides includes depositing an oxide selected from the group including silicon oxide and silicon oxynitride.

In some aspects, depositing an M oxide layer in Step 706 includes depositing an M oxide layer with a refractive index first value. Then, improving M—O bonding in the M oxide layer in Step 712 includes increasing the refractive index first value. In some aspects, depositing an M oxide layer in Step 706 includes depositing an M oxide layer with a leakage current first value. Then, improving M—O bonding in the M oxide layer in Step 712 includes decreasing the leakage current first value.

In some aspects, depositing an M oxide layer in Step 706 includes depositing the M oxide layer at temperatures equal to and greater than 400° C. In some aspects, depositing an M oxide layer in Step 706 includes depositing the first M oxide layer at a temperature less than 400° C.

Figure 8:
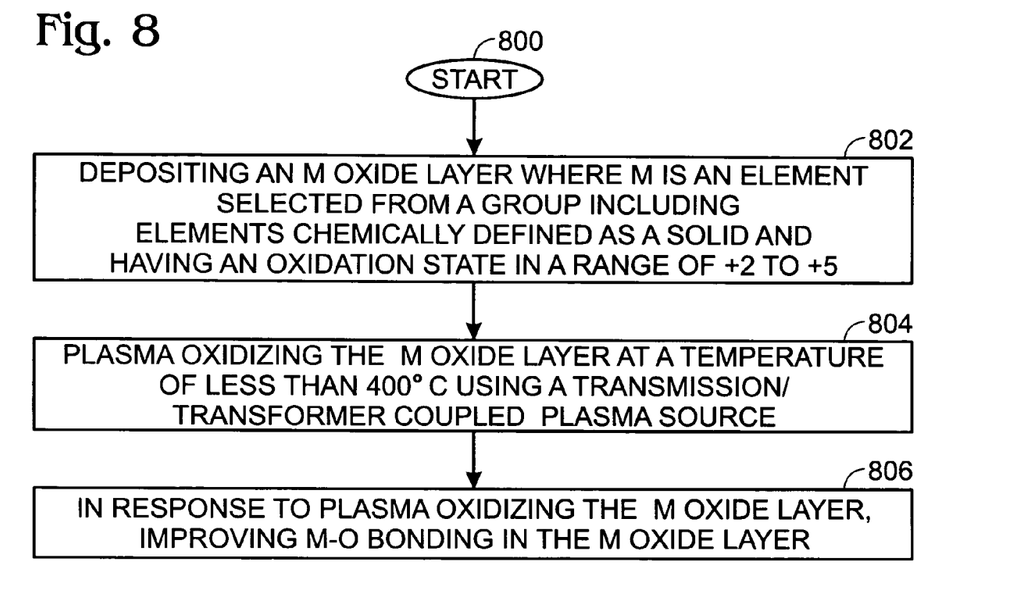
FIG. 8 is a flowchart illustrating a present invention method for bonding oxygen in an oxide layer.

FIG. 8 is a flowchart illustrating a present invention method for bonding oxygen in an oxide layer. The method starts with Step 800. Step 802 deposits an M oxide layer where M is an element selected from a group including elements chemically defined as a solid and having an oxidation state in a range of +2 to +5. Step 804 plasma oxidizes the M oxide layer at a temperature of less than 400°

C. using a transmission/transformer coupled (TCP) plasma source. Step 806, in response to plasma oxidizing the M oxide layer, improves M—O bonding in the M oxide layer. In some aspects, plasma oxidizing the oxide layer at a temperature of less than 400° C. using a TCP source in Step 804 includes plasma oxidizing the oxide layer at a temperature of less than 200° C. In some aspects, plasma oxidizing the oxide layer at a temperature of less than 200° C. includes plasma oxidizing the oxide layer at a temperature of less than 50° C.

Figure 9:
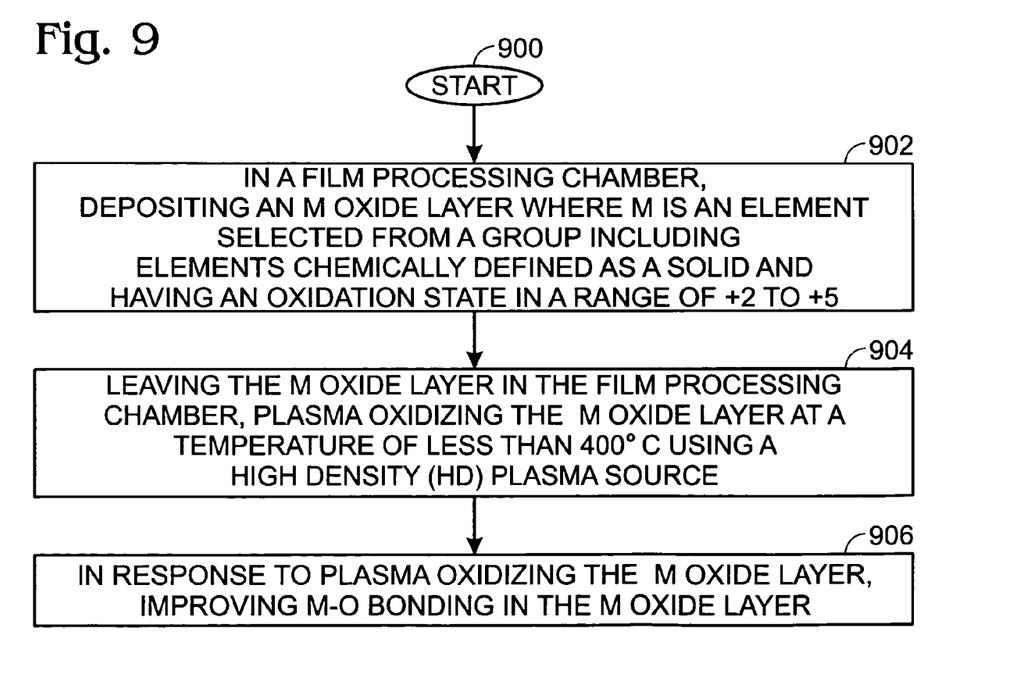
FIG. 9 is a flowchart illustrating a present invention in-situ method for bonding oxygen in an oxide layer.

FIG. 9 is a flowchart illustrating a present invention in-situ method for bonding oxygen in an oxide layer. The method starts with Step 900. Step 902, in a film processing chamber, deposits an M oxide layer where M is an element selected from a group including elements chemically defined as a solid and having an oxidation state in a range of +2 to +5. Step 904, leaving the M oxide layer in the film processing chamber, plasma oxidizes the M oxide layer at a temperature of less than 400° C. using an HD plasma source. Step 906, in response to plasma oxidizing the M oxide layer, improves M—O bonding in the M oxide layer. Leaving in the first chamber, the M oxide layer (Step 904) means that Step 904 is performed in-situ with the previous step, Step 902. In some aspects, plasma oxidizing the oxide layer at a temperature of less than 400° C. using an HD source in Step 904 includes plasma oxidizing the oxide layer at a temperature of less than 200° C. In some aspects, plasma oxidizing the oxide layer at a temperature of less than 200° C. includes plasma oxidizing the oxide layer at a temperature of less than 500° C.

A deposition M oxide interface, with improved M-oxygen bonding, overlying a transparent substrate has been provided. A method to fabricate the above-mentioned M oxide interface also has been provided. However, use of the present invention is not limited to transparent substrates. The present invention can be used on any substrate sensitive to temperatures greater than 400° C. In addition, the present invention can be used to form M oxide layers in other applications, such as forming a diffusion barrier for a TFT or other IC device.

Examples have been provided of some material thicknesses and of some configurations, such as a TFT. Likewise, some process specifics have been given to clearly explain the fundamental concepts. However, the present invention is not limited to just those thickness, configurations, or specifics. Other variations and embodiments of the present invention will occur to those skilled in the art.

Although the invention has been described with reference to particular embodiments, the description is only an example of the invention' application and should not be taken as a limitation. Consequently, various adaptations and combinations of features of the embodiments disclosed are within the scope of the invention as encompassed by the following claims.

I claim:

1. A method for bonding oxygen in an oxide layer, the method comprising:
   depositing an M oxide layer where M is a first element selected from a group including elements chemically defined as a solid and having an oxidation state in a range of +2 to +5;
   plasma oxidizing the M oxide layer at a temperature of less than 400° C. using a high density (HD) inductively coupled plasma (ICP) source, diffusing oxygen radicals into the M oxide layer; and,
   in response to plasma oxidizing the M oxide layer, improving M-oxygen (M—O) bonding in the M oxide layer.

2. The method of claim 1 wherein improving M—O bonding in the M oxide layer includes bonding oxygen radicals to element M in the M oxide layer.

3. The method of claim 2 wherein depositing an M oxide layer includes depositing a first M oxide molecule with a first number of bonded oxygen atoms;
   wherein bonding oxygen radicals to M atoms in the M oxide layer includes bonding oxygen radicals to the first M oxide molecule; and,
   wherein improving M—O bonding in the M oxide layer includes increasing the number of bonded oxygen atoms in the first M oxide molecule to a second number greater than the first number.

4. The method of claim 2 wherein bonding oxygen radicals to M atoms in the M oxide layer includes bonding oxygen radicals to dangling M bonds.

5. The method of claim 2 wherein diffusing excited oxygen radicals into the M oxide layer includes breaking process-induced impurity bonds attached to a first M atom; and,
   wherein bonding oxygen radicals to M atoms in the M oxide layer includes bonding oxygen radicals to the first M atom.

6. The method of claim 1 wherein depositing an M oxide layer includes depositing an M oxide molecule with M—O bonds in a non-stoichiometric energy state; and,
   wherein improving M—O bonding in the M oxide layer includes converting non-stoichiometric M—O bonds to stoichiometric M—O bonds.

7. The method of claim 1 wherein using an ICP source includes inductively coupling plasma:
   in a range of 13.56 to 300 megahertz (MHz) with a power density up to 10 watts per square centimeter (W/cm$^2$);
   at a pressure of up to 500 milliTorr (mTorr);
   with a mixture of inert gas and oxygen in a ratio of approximately 10:1 to 200:1; and,
   with a total gas flow of approximately 50 to 200 standard cubic centimeters per minute (sccm).

8. The method of claim 7 wherein inductively coupling plasma includes using a low frequency power source at 50 kilohertz (KHz) to 13.56 MHz with a power density of 0.1 to 1.6 W/cm$^2$.

9. The method of claim 7 wherein inductively coupling plasma with a mixture of inert gas and oxygen includes mixing oxygen with inert gas selected from the group including helium, argon, and krypton.

10. The method of claim 7 wherein depositing an M oxide layer includes depositing an M oxide layer where M is silicon.

11. The method of claim 10 further comprising:
    forming a silicon layer; and,
    wherein depositing an M oxide layer where M is silicon includes using an HD plasma enhanced chemical vapor deposition (HD-PECVD) process to deposit, overlying the silicon layer, the M oxide layer:
    at a temperature of 150° C.;
    using a radio frequency (RF) power source at 13.56 MHz with a power density of 0.1 to 1.6 W/cm$^2$;
    at a pressure of 10 to 250 mTorr;
    with a mixture of $SiH_4$, $N_2O$, and $N_2$ gases in a ratio of 5–25:50–200:10–100; and,
    with a refractive index of 1.44;
    wherein inductively coupling plasma includes inductively coupling plasma at a temperature of 150° C.:
    using an RF power source at 13.56 MHz with a power density of 0.1 to 1.6 W/cm$^2$; and,
    at a pressure of 10 to 500 mTorr; and, wherein improving M—O bonding in the M oxide layer includes increasing the M oxide layer refractive index value to 1.46.

12. The method of claim 11 further comprising:
forming a transparent substrate layer; and,
forming a diffusion barrier overlying the substrate layer and underlying the silicon layer; and,
wherein forming a silicon layer includes forming transistor channel, source, and drain regions in the silicon layer;
wherein using an HD-PECVD process to deposit the M oxide layer includes depositing a gate dielectric layer overlying the silicon layer;
wherein inductively coupling plasma at a temperature of 150° C. includes plasma oxidizing the gate dielectric layer; and,
the method further comprising:
forming a gate electrode overlying the gate dielectric layer.

13. The method of claim 12 wherein using the HD-PECVD process to deposit a gate dielectric layer overlying the silicon layer includes depositing a gate dielectric layer with a thickness of 500 angstroms (Å); and,
wherein improving M—O bonding in the M oxide layer includes, in the gate dielectric layer:
decreasing a fixed oxide charge density ($N_f$) from $26.0 \times 10^{11}$ to $1.8 \times 10^{11}$ per square centimeter ($/cm^2$);
decreasing an interface trap concentration from $3.5 \times 10^{10}$ to $1.2 \times 10^{10}$ per square centimeter—electron volt ($/cm^2 eV$);
decreasing a flat band voltage shift ($V_{FB}$) from $-7.5$ to $-0.8$ volts (V);
decreasing a leakage current density (J) from $1.8 \times 10^{-7}$ to $2.6 \times 10^{-8}$ amperes per square centimeter ($A/cm^2$) at an applied electric field of 2 megavolts per centimeter (MV/cm);
increasing a breakdown field strength (EBD) from 6.8 to 7.2 MV/cm;
increasing an electric field strength (E) associated with a J of $1 \times 10^{-8}$ $A/cm^2$ from 4.3 to 6.4 MV/cm; and,
maintaining a bias temperature shift (BTS) of less than 1 V under dual bias ($\pm 2$ MV/cm) temperature stress at 150° C.

14. The method of claim 11 wherein forming a silicon layer includes forming a layer selected from the group including amorphous silicon, microcrystalline silicon, and polycrystalline silicon.

15. The method of claim 1 wherein depositing an M oxide layer where M is an element selected from a group including elements chemically defined as a solid and having an oxidation state in a range of +2 to +5 includes depositing an M oxide selected from the group including M binary oxides and M multi-component oxides.

16. The method of claim 1 wherein depositing an M oxide layer includes depositing an M oxide layer with a refractive index first value; and,
wherein improving M—O bonding in the M oxide layer includes increasing the refractive index first value.

17. The method of claim 1 wherein depositing an M oxide layer includes depositing an M oxide layer with a leakage current first value; and,
wherein improving M—O bonding in the M oxide layer includes decreasing the leakage current first value.

18. The method of claim 1 wherein plasma oxidizing the M oxide layer at a temperature of less than 400° C. includes plasma oxidizing the M oxide layer at a temperature of less than 200° C.

19. The method of claim 18 wherein plasma oxidizing the M oxide layer at a temperature of less than 200° C. includes plasma oxidizing the M oxide layer at a temperature of less than 50° C.

20. The method of claim 1 wherein depositing an M oxide layer includes depositing the M oxide layer at temperatures equal to and greater than 400° C.

21. The method of claim 1 wherein depositing an M oxide layer includes depositing the M oxide layer at a temperature less than 400° C.

22. A method for bonding oxygen in an oxide layer, the method comprising:
depositing an M oxide layer where M is an element selected from a group including elements chemically defined as a solid and having an oxidation state in a range of +2 to +5;
plasma oxidizing the M oxide layer at a temperature of less than 400° C. using a transmission/transformer coupled plasma source; and,
in response to plasma oxidizing the M oxide layer, improving M—O bonding in the M oxide layer.

23. A method for bonding oxygen in an oxide layer, the method comprising:
depositing an M oxide layer where M is a first element selected from a group including elements chemically defined as a solid and having an oxidation state in a range of +2 to +5;
plasma oxidizing the M oxide layer at a temperature of less than 50° C. using a high density (HD) plasma source; and,
in response to plasma oxidizing the M oxide layer, improving M-oxygen (M—O) bonding in the M oxide layer.

24. A method for bonding oxygen in an oxide layer, the method comprising:
depositing an M oxide layer where M is a first element selected from a group including elements chemically defined as a solid and having an oxidation state in a range of +2 to +5;
plasma oxidizing the M oxide layer at a temperature of less than 400° C. using a high density (HD) plasma source selected from the group inducting electron cyclotron resonance (ECR) plasma sources and cathode-coupled plasma sources; and,
in response to plasma oxidizing the M oxide layer, improving M-oxygen (M—O) bonding in the M oxide layer.

* * * * *